(12) United States Patent
Sellke et al.

(10) Patent No.: US 12,270,844 B2
(45) Date of Patent: Apr. 8, 2025

(54) GROUND CONDUCTOR MONITORING

(71) Applicant: WAGO Verwaltungsgesellschaft mbH, Minden (DE)

(72) Inventors: Frank Sellke, Minden (DE); Jan Rewald, Rahden (DE)

(73) Assignee: Wago Verwaltungsgesellschaft MBH, Minden (DE)

( * ) Notice: Subject to any disclaimer, the term of this patent is extended or adjusted under 35 U.S.C. 154(b) by 782 days.

(21) Appl. No.: 17/148,178

(22) Filed: Jan. 13, 2021

(65) Prior Publication Data

US 2021/0132127 A1    May 6, 2021

Related U.S. Application Data

(63) Continuation of application No. PCT/EP2019/068727, filed on Jul. 11, 2019.

(30) Foreign Application Priority Data

Jul. 13, 2018 (DE) ...................... 20 2018 104 044.8

(51) Int. Cl.
  *G01R 31/52* (2020.01)
  *G01R 15/22* (2006.01)
  (Continued)

(52) U.S. Cl.
  CPC ............. *G01R 27/18* (2013.01); *G01R 15/22* (2013.01); *G01R 19/16576* (2013.01); *G01R 31/52* (2020.01)

(58) Field of Classification Search
  CPC ................................ G01R 31/52; G01R 27/18
  See application file for complete search history.

(56) References Cited

U.S. PATENT DOCUMENTS

| 3,205,436 A | * | 9/1965 | Donahue | ................ | G01R 27/18 |
| | | | | | 324/508 |
| 7,317,316 B2 | * | 1/2008 | Leitz | ...................... | G01R 31/36 |
| | | | | | 429/432 |

(Continued)

FOREIGN PATENT DOCUMENTS

| CN | 102822930 A | 12/2012 |
| CN | 104685748 A | 6/2015 |

(Continued)

OTHER PUBLICATIONS

International Search Report dated Sep. 24, 2019 in corresponding application PCT/EP2019/068727.

(Continued)

*Primary Examiner* — Lee E Rodak
*Assistant Examiner* — Demetrius R Pretlow
(74) *Attorney, Agent, or Firm* — Muncy, Geissler, Olds & Lowe, P.C.

(57) ABSTRACT

A ground conductor monitoring device, having: at least one ground conductor connection which is designed to connect a ground conductor potential, at least one first potential connection which is designed to connect a first electrical potential which differs from the ground conductor potential, at least one second potential connection which is designed to connect a second electrical potential which differs from the first potential and the ground conductor potential, at least one electrical switching device which is designed to establish an electrical connection, optionally in accordance with an electrical control signal, between the first potential connection and the ground conductor connection (connection state) or to interrupt same (interruption state), at least one control unit which is designed to automatically output control signals to the electrical switching device.

21 Claims, 2 Drawing Sheets

(51) Int. Cl.
*G01R 19/165* (2006.01)
*G01R 27/18* (2006.01)

(56) References Cited

U.S. PATENT DOCUMENTS

| | | | |
|---|---|---|---|
| 7,576,547 B2 | 8/2009 | Müller | |
| 9,823,288 B2 | 11/2017 | de Boer | |
| 10,416,223 B2* | 9/2019 | Kawamura | H01M 10/48 |
| 11,183,967 B2* | 11/2021 | Nesemann | H02S 50/00 |
| 2006/0255656 A1* | 11/2006 | Linebach | B60L 9/005 |
| | | | 303/113.2 |
| 2008/0084213 A1* | 4/2008 | Waite | H02H 3/006 |
| | | | 324/424 |
| 2009/0256576 A1* | 10/2009 | Weems, II | G01R 31/52 |
| | | | 324/520 |
| 2010/0207635 A1* | 8/2010 | Plagens | B60L 3/0023 |
| | | | 324/509 |
| 2010/0295693 A1* | 11/2010 | Jonsson | H01R 9/2625 |
| | | | 361/42 |
| 2011/0268289 A1* | 11/2011 | Baranwal | H03F 3/45475 |
| | | | 381/74 |
| 2012/0182024 A1* | 7/2012 | Ike | G01R 31/52 |
| | | | 324/509 |
| 2013/0026960 A1* | 1/2013 | Fujimoto | H02P 21/06 |
| | | | 318/400.21 |
| 2013/0176042 A1* | 7/2013 | Huh | B60L 3/0046 |
| | | | 324/693 |
| 2013/0285670 A1* | 10/2013 | Yoshidomi | G01R 31/52 |
| | | | 324/510 |
| 2014/0145727 A1* | 5/2014 | Ike | G01R 31/52 |
| | | | 324/509 |
| 2014/0225444 A1* | 8/2014 | Yoshidomi | G01R 31/52 |
| | | | 324/509 |
| 2015/0192630 A1* | 7/2015 | Tsukamoto | G01R 31/40 |
| | | | 324/426 |
| 2016/0154046 A1* | 6/2016 | Dong | G01R 31/085 |
| | | | 324/509 |
| 2017/0138995 A1* | 5/2017 | Rodrigues | G01R 27/025 |
| 2017/0227593 A1* | 8/2017 | Hackl | H02H 5/105 |
| 2017/0302082 A1* | 10/2017 | Weng | H02S 50/10 |
| 2017/0310276 A1* | 10/2017 | Takeuchi | H02S 30/10 |
| 2019/0086464 A1* | 3/2019 | Kawamura | G01R 27/025 |
| 2019/0100104 A1* | 4/2019 | Kawamura | G01R 31/14 |
| 2019/0128943 A1* | 5/2019 | Kawamura | H01M 10/48 |
| 2019/0195931 A1* | 6/2019 | Kawamura | B60L 3/0069 |
| 2019/0310300 A1* | 10/2019 | Kawamura | H03K 17/6871 |
| 2020/0194992 A1* | 6/2020 | Mandelkau | H02H 1/0007 |
| 2021/0270910 A1* | 9/2021 | Yamaguchi | G01R 31/14 |

FOREIGN PATENT DOCUMENTS

| | | | | |
|---|---|---|---|---|
| DE | 3330869 A1 | 4/1985 | | |
| DE | 102006022686 A1 | 11/2007 | | |
| DE | 102012219542 A1 * | 7/2013 | | G01R 31/3277 |
| EP | 2237057 A1 | 10/2010 | | |
| EP | 2574939 A2 | 4/2013 | | |
| EP | 2945240 A1 * | 11/2015 | | G01R 31/50 |
| KR | 20090032380 A * | 4/2009 | | |

OTHER PUBLICATIONS

International Preliminary Report on Patentability dated Jan. 28, 2021 in corresponding application PCT/EP2019/068727.

* cited by examiner

GROUND CONDUCTOR MONITORING

This nonprovisional application is a continuation of International Application No. PCT/EP2019/068727, which was filed on Jul. 11, 2019, and which claims priority to German Patent Application No. DE 20 2018 104 044.8, which was filed in Germany on Jul. 13, 2018 and which are both herein incorporated by reference.

BACKGROUND OF THE INVENTION

Field of the Invention

The present invention relates to a ground conductor monitoring device. The invention also relates to a computer program for executing a method for monitoring a ground conductor of an electrical device which is grounded by means of the ground conductor, which supplies electrical energy and/or is supplied with electrical energy by means of a first electrical potential which differs from the ground conductor potential, and a second electrical potential which differs from the first potential and the ground conductor potential.

Description of the Background Art

When operating electrical machinery and systems, the safety of persons and safe operation of the electrical device are paramount. Fault and overcurrent protection elements are used for this purpose. The prerequisite for this is to connect such machinery and equipment to a ground conductor, which is also referred to as a protective conductor, to achieve low impedance grounding. The invention thus relates to the field of connection technology for electrical devices that have a ground conductor connection (or protective conductor connection).

In automation technology, for example, a power supply unit in the control cabinet is used to generate a supply voltage for electrical devices built into the control cabinet. Such a power supply unit is usually connected to a ground conductor via a ground conductor connection. In such applications, the devices are often attached to a mounting rail in the control cabinet. The mounting rail is often used as a ground conductor.

To ensure continuous safety in the operation of such systems, regular ground fault testing is required. The existence of a so-called ground fault must be checked, i.e. a short circuit of one of the two supply potentials of the power supply unit to the ground conductor. The supply potentials of the power supply unit can be, e.g., 0 volts and operating voltage, e.g. 24 volts DC voltage. So-called ground conductor disconnect terminals, which have a manually operated knife disconnect, have been used for these ground fault tests. By means of the knife disconnect, the connection of the 0 volt line normally available can be separated by means of the ground conductor. A measurement can then be carried out in the disconnected state, which can be used to identify whether there is a ground fault.

SUMMARY OF THE INVENTION

It is therefore an object of the present invention to reduce the costs for such ground fault tests.

This object is achieved in an exemplary embodiment by a ground conductor monitoring device, that includes: at least one ground conductor connection which is designed to connect a ground conductor potential, at least one first potential connection which is designed to connect a first electrical potential which differs from the ground conductor potential, at least one second potential connection which is designed to connect a second electrical potential which differs from the first potential and the ground potential, at least one electrical switching device which is designed to connect (connection state) or interrupt (interruption state), optionally in accordance with an electrical control signal, an electrical connection between the first potential connection and the ground conductor connection, at least one control unit designed to automatically output control signals to the electric switching device.

The invention has the advantage that the ground fault tests no longer have to be carried out manually, but instead can be carried out at least partially automatically using the ground conductor monitoring device according to the invention. This significantly reduces staff resources. In addition, safety is increased since the automatic ground fault test can be carried out much more often than was previously possible with manual processes. During the manual check, ground fault testing is typically performed at three month intervals. The ground conductor monitoring device according to the invention makes semi-permanent ground fault testing possible.

Another advantage of the invention is that by means of the invention, slowly emerging ground faults can be detected. Therefore, proactive maintenance of electrical systems is possible by means of the invention. In this way, problematic downtime of such systems can be avoided or at least reduced since proactive maintenance can be carried out.

In an advantageous example of the invention, the latter can be facilitated by not only recognizing low impedance short circuits of the ground conductor to the first electrical potential or the second electrical potential, but also already connections with slightly higher impedance, for example in the range of several kiloohm. In addition, due to the semi-permanent monitoring of the invention, it is possible to detect intermittent ground faults.

In an application in automation technology, the first electrical potential can be, for example, a 0 volt potential. The second electrical potential can be the operating voltage of the power supply unit of the automation system, for example, a low voltage, in particular a direct voltage. The second electrical potential may be, for example a 12 volt, 24 volt or 48 volt potential.

The electrical switching device can be implemented in a wide variety of ways. In a first variant, it is possible to continue to use the previous, manually operated knife disconnect of the ground conductor disconnect terminal and to drive it automatically by an electric drive, for example by means of an electric motor or an electric magnet. In a second variant, it is possible to implement the electrical switching device by means of an electromechanical switch, for example a relay or a contactor. In a third variant, the electrical switching device can be designed as a semiconductor switch, for example as a transistor, a thyristor or a circuit arrangement made up of transistors and/or thyristors. This has the advantage that switching between the connection state and the interruption state is basically possible free of wear and noise. Furthermore, the electric switching device is inexpensive and can be realized with a very small footprint.

The electrical switching device can have at least two switching states, namely a connection state and an interruption state. In the connection state, the first potential connection is connected to the ground conductor connection via the electrical switching device; in the interruption state, the electrical connection between the first potential connection and the ground conductor connection is interrupted by means of the electrical switching device. It is advantageous if the electrical switching device in the connection state connects the first potential terminal with relatively low impedance to the ground conductor connection. The electrical switching device can have further switching states, for example an intermediate state in which the electrical connection between the first potential connection and the ground conductor connection is established with a higher impedance than in the connection state.

The control device can be designed to evaluate electrical signals at the ground conductor connection, at least in the interruption state. In this way, it is possible that the ground conductor monitoring device according to the invention can be used to carry out ground fault tests that are comparable with the previous manual procedure. The control device may be additionally designed to evaluate electrical signals at the ground conductor connection also in the connection state.

The control device can be designed to use the control signals generated by the control device to automatically switch the electrical switching device between the switching states connection state and interruption state at predetermined regular and/or irregular time intervals. In this way, the previous manual ground fault test can be carried out completely automatically. The automatic execution can in particular significantly increase the test frequency, for example to several ground fault tests per minute. In particular, the control device can generate a switch-on signal and a switch-off signal as control signals and send them to the electrical switching device. These switch-on and switch-off signals then result in a pulse width modulated signal (PWM signal) with which the electrical switching device is driven.

According to an example of the invention, it is provided that averaged over time, the connection state is activated more often than the interruption state. This has the advantage that only short test pulses in which the interruption state is present are required for the evaluation of the electrical signals at the ground conductor connection. Otherwise, the desirable connection state per se is always available. Due to the fact that, averaged over time, the connection state is available more frequently than the interruption state, in the event of failure, i.e. with a reported ground fault, proper activation of the safeguards can be ensured. In this way, the applicable regulations can be met.

Thus, for example, the pulse width modulated signal can be switched with a of 95% switch-on-time to 5% switch-off-time. Accordingly, the connection status is present 95% of the time. Generally speaking, the duty cycle can, for example, be in the range of 90% to 99% switch-on-time. The switch-off duration, i.e. the duration of the interruption state, can be less than 500 ms, or less than 100 ms or less than 10 ms. The cycle time of the pulse width modulated signal can be 10 seconds, for example. In general, it is also possible to achieve significantly shorter cycle times. In order meet the applicable regulations, it is advantageous if the switch-on-time of the pulse width modulated signal amounts to at least five seconds.

The evaluation of the electrical signals at the ground conductor connection can occur without measuring the current at the ground conductor. This has the advantage that for the ground fault tests, no complex components such as shunts are required. In addition, risks that may result from an interruption in the ground conductor can be minimized.

The ground conductor monitoring device can be designed to use the evaluated electrical signals at the ground conductor connection to recognize whether the ground conductor is connected to the first electrical potential and/or whether the ground conductor is connected to the second electrical potential. In this way, the ground conductor monitoring device according to the invention can be used to detect at least the same faults at the ground conductor as in the previous manual inspections.

The ground conductor monitoring device can comprises a light signal device via which a light signal can be emitted automatically when the ground conductor monitoring devices recognizes that the ground conductor is connected to the first potential and/or the ground conductor is connected to the second potential. The light signal device can have one or more light sources. In this way, the presence of a ground fault can be visually signaled to a user. For example, a warning signal via one or several light sources can be emitted, for example, via light emitting diodes (LEDs) or glow lamps.

The ground conductor monitoring device can have an output interface, via which a warning signal can be automatically output when the ground conductor monitoring device recognizes that the ground conductor is connected to the first potential and/or the ground conductor is connected to the second potential. In this manner, the ground conductor monitoring device can be used to control a system connected thereto, for example a host computer (PLC).

The output interface can have a floating output connection. This has the advantage that further components can be connected to the output connection in a simple manner. The output connection can be, for example, designed as an ISO-OK contact. Alternatively or additionally, the output connection can also be a data bus connection, so that the warning signal can be transmitted via a data bus.

The ground conductor monitoring device can have an evaluation circuit via which the electrical signals at the ground conductor connection can be evaluated by means of the control device at least in the interruption state. This has the advantage that the monitoring is provided using circuit technology, so that quick monitoring is possible and no software-related delays or other disadvantages can occur.

The other components of the ground conductor monitoring device, in particular the control unit, can be designed completely without a computer or another unit executing a computer program, for example in terms of a logic circuit. For the generation of the control signals, the control unit can have, for example, a hardware timer.

The evaluation circuit can comprises at least one first voltage detector switched between the ground conductor connection and the first potential connection and/or at least one second voltage detector switched between the ground conductor terminal and the second potential connection. This allows for easy acquisition and evaluation of the electrical signals at the ground conductor connection. The first voltage detector and/or the second voltage detector may, for example, have a trigger threshold so that the voltage detector outputs a trigger signal as an output signal when the voltage monitored by the voltage detector reaches, exceeds or falls below the trigger threshold. This enables a simple downstream signal processing of the trigger signals, which can be designed as binary signals. The trigger signals can then be further evaluated, for example, using evaluation logic, for example using flip-flop memory.

The first voltage detector can be designed to record the insulation resistance between the ground conductor connection and the first potential connection. The second voltage detector can be designed to record the insulation resistance between the ground conductor connection and the second potential connection. For example, the above mentioned trigger signal can be generated when the insulation resistance is below a predetermined resistance value, for example a value of 1 kΩ.

According to an advantageous embodiment of the invention, it is provided that the first and/or the second voltage detector is formed as an optocoupler, or comprises an optocoupler. This allows for a simple, inexpensive and long-lasting implementation of the first and/or second voltage detector. The optocouplers can in particular be switched in such a way that the respective light emitting diode of the optocoupler is switched off if there is no ground fault. Only in the event of a fault, when a ground fault is present, does the light emitting diode switch on. In this way, the light emitting diodes of the optocouplers can be preserved.

The ground conductor monitoring device can comprise a power supply device which is designed to supply at least the control unit and the electric switching device with electric power needed for operation, wherein the power supply unit extracts the electrical energy from the first and the second potential connection and outputs it in a buffered manner by means of a buffer circuit. The buffer circuit may particularly be designed in such a way that periods of time in which the connection state is available can be bridged, i.e., even in the connection state, the electrical switching device and the control unit continue to be supplied with electrical power. The buffer circuit can in particular have a buffer capacitor. In this way, it can be avoided that the functioning of the ground conductor monitoring device is disrupted when the ground conductor is short-circuited with relatively low impedance to the second electrical potential connection.

The ground conductor monitoring device an be designed as a terminal block or arranged in or on a terminal block. The ground conductor monitoring device can, for example, be structurally integrated into the housing of a terminal block. A terminal block is an article used in electrical installation technology which is designed to be fastened to a mounting rail and can be lined up with other terminal blocks side by side on the mounting rail. A terminal block comprises a plurality of conductor connections, for example spring-force clamping connections, so that several electrical conductors can be connected to the terminal block.

The object mentioned above is also achieved by a method for monitoring a ground conductor of an electrical system grounded by means of the ground conductor, which by means of a first electric potential which differs from the ground conductor potential and by means of a second electrical potential which differs from the first potential and the ground conductor potential, supplies electrical energy and/or is supplied with electrical energy, including the following features: at least one electrical switching device is used to automatically switch between the switching states connection state and interruption state at certain predetermined regular and/or irregular time intervals, wherein an electrical connection between the first electrical potential and the ground conductor is produced by means of the electrical switching device in the connection state, and in the interruption state, the electrical connection between the first electrical potential and the ground conductor is interrupted by means of the electrical switching device; at least in the interruption state, electrical signals at the ground conductor are recorded and evaluated, whereby the evaluated electrical signals at the ground conductor are used to detect whether the ground conductor is connected to the first electrical potential and/or whether the ground conductor is connected to the second electrical potential.

A warning signal can be emitted when it is recognized that the ground conductor is connected to the first potential and/or when the ground conductor is connected to the second potential. In this way, a user is signaled the existence of a ground fault. For example, a warning signal may be emitted via a plurality of light sources, for example, via light emitting diodes (LEDs) or glow lamps, or via the output interface.

The method can be performed by means of a ground conductor monitoring device of the type described above.

The object mentioned above is also achieved by a computer program with program code, designed to carry out a method of the type described above when the computer program is run on a computer. The advantages described above can also be realized in this way.

In the context of the present invention, the undefined term "a" is not to be understood as a numerical word. For example, when a component is mentioned, this is to be interpreted in the sense of "at least one component". As far as angle specifications are given in degrees, these refer to a circle of 360 degrees (360°). As far as a computer is mentioned, it can be designed to run a computer program, for example in the sense of software. The computer can be designed as a commercially available computer, such as a PC, laptop, notebook, tablet or smartphone, or as a microprocessor, microcontroller or FPGA, or as a combination of such elements.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
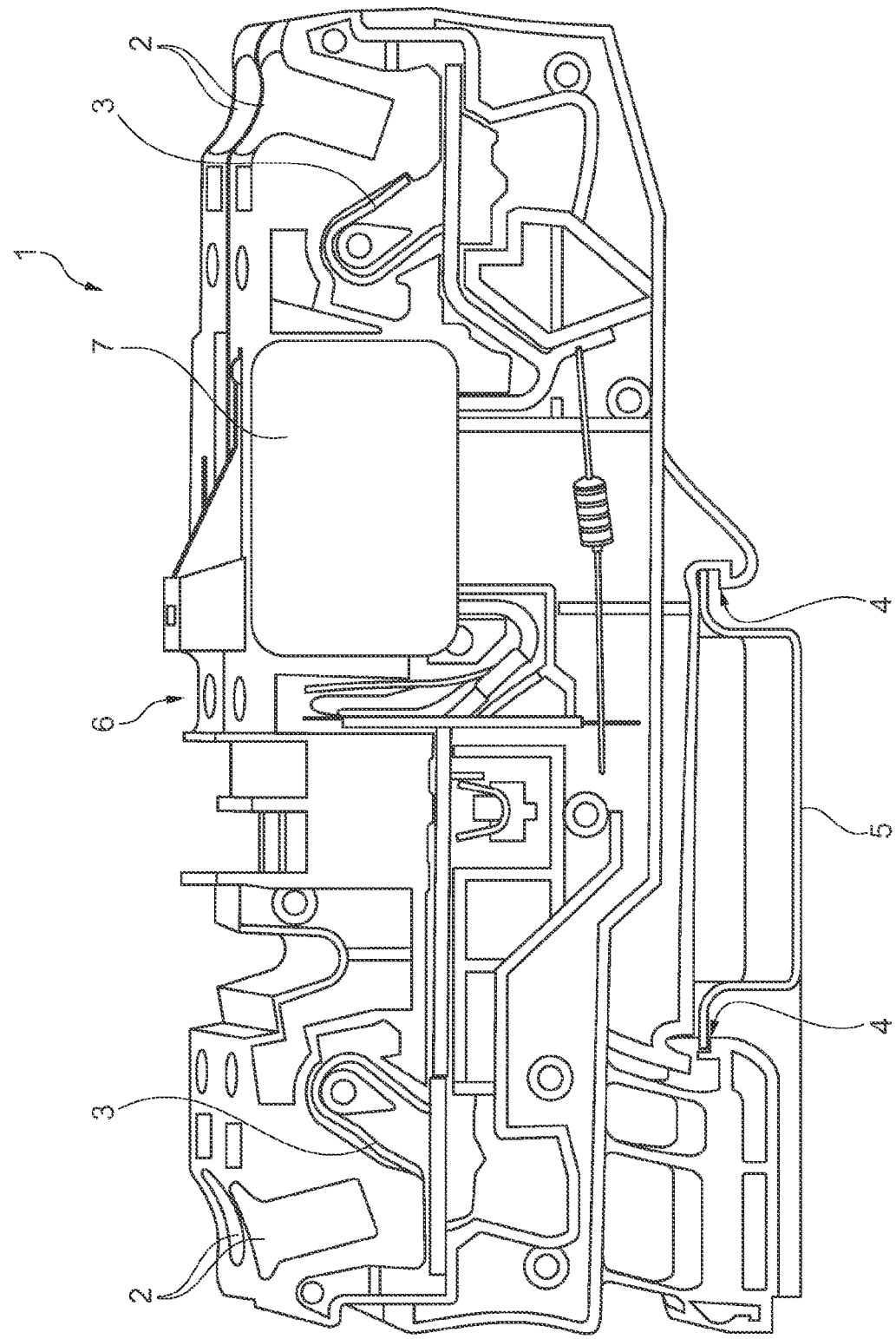
FIG. 1 shows a terminal block having a ground conductor monitoring device.

FIG. 1 shows a terminal block 1 which is designed for attachment to a mounting rail 5. For this purpose, the terminal block 1 has mounting rail fastening elements 4 on a housing side aligned with the mounting rail 5. The terminal block 1 can, for example, be snapped on the mounting rail 5 by means of the mounting rail fastening elements 4. The mounting rail 5 can have the ground conductor potential PE.

The terminal block 1 has several conductor insertion openings 2 which lead to respective conductor connections 3. The conductor connections 3 can advantageously be designed as spring force-clamping connections. Electrical conductors inserted in the conductor insertion openings 2 can be electrically connected to the terminal block 1 via the conductor connections 3.

The terminal block 1 also comprises a ground conductor monitoring device 7. There is a light signal unit 6 on a housing side facing away from the mounting rail fastening elements 4 which are part of the ground conductor monitoring device 7. A ground fault detected by the ground conductor monitoring device 7 can be signaled visually, for example, via the light signal unit 6.

Figure 2:
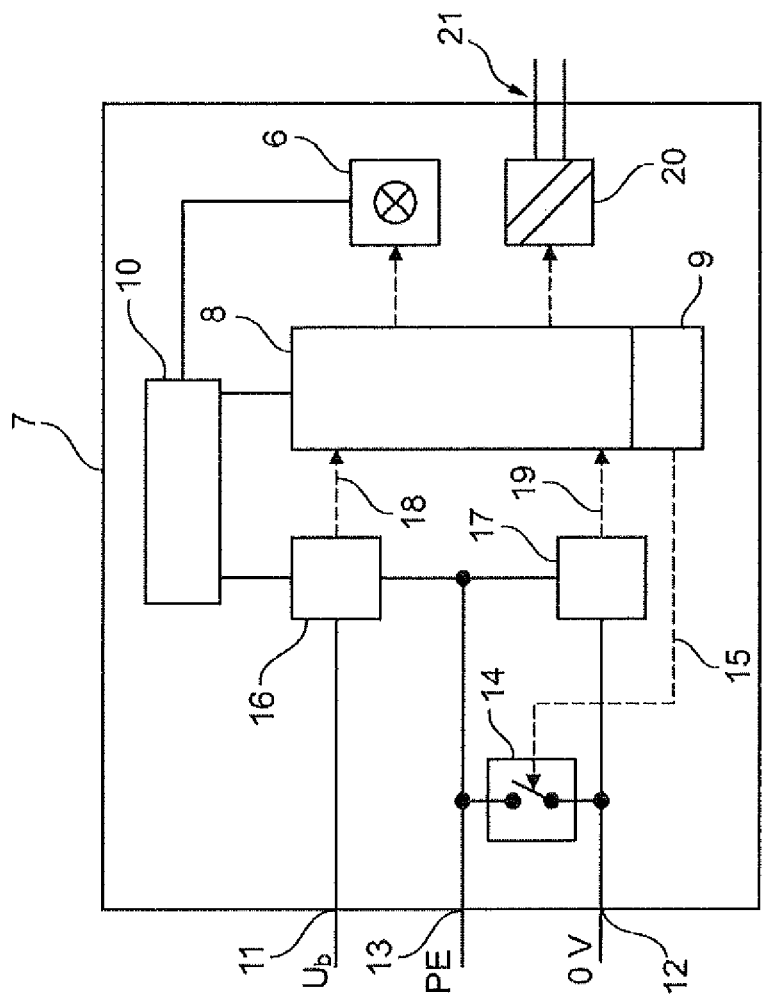
FIG. 2 shows a ground conductor monitoring device in a schematic view.

FIG. 2 shows the structure of the ground conductor monitoring device 7. The ground conductor monitoring device 7 has a ground conductor connection 13 to which a ground conductor potential PE can be connected. The ground conductor monitoring device 7 has a first potential connection 12 to which a first potential 0 V can be connected. The ground conductor monitoring device 7 has a second potential connection 11 to which a second electrical potential $U_b$ can be connected.

The ground conductor monitoring device 7 also has an electrical switching device 14, an evaluation circuit comprising a first voltage detector 17 and a second voltage detector 16, a control unit 8 with a timer 9, the light signal unit 6, an output interface 20 and a power supply device 10. The power supply device 10 is used to supply the components of the ground conductor monitoring device 7 that are to be electrically supplied with electrical energy. The electrical energy required for the supply is obtained from the voltage difference between the first potential connection 12 and the second potential connection 11.

The control unit 8 is connected, in this case via its timer 9, via a signal line 15 to a control input of the electrical switching device 14. Via the signal line 15, the timer 9 can output electrical control signals to the electrical switching device 14 and thus control it in such a way that an electrical connection between the first potential terminal 12 and the ground conductor connection 13 is established or interrupted.

The first voltage detector 17 is connected to the first potential connection 12 and the ground conductor connection 13. The first voltage detector 17 can thus evaluate the voltage between these connections. Upon detection of a certain voltage between these connections, which indicates falling below a specific insulation resistance, the first voltage detector 17 outputs a signal via a signal line 19 to the control unit 8. This signal then indicates a ground fault of the second potential connection 11.

The second voltage detector 16 is connected to the second potential connection 11 and the ground conductor connection 13. The second voltage detector 16 can thus evaluate the voltage between these connections. When detecting a certain voltage between these connections, which indicates falling below a specific insulation resistance, the second voltage detector 16 emit a signal via a signal line 18 to the control unit 8. This signal then indicates a ground fault of the first potential connection 12.

The signals received via the signal lines 18, 19 are evaluated in the control unit 8, and the light signal device 6 is activated in the event of a ground fault. Alternatively or additionally, a warning signal can be output via the output interface 20 to an output connection 21. This can be used to control a PLC, for example.

Figure 3:
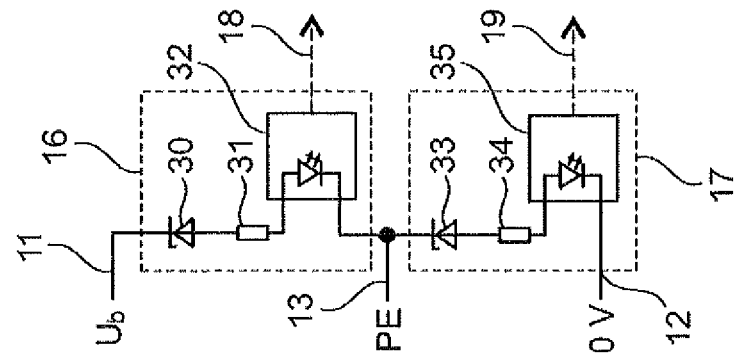
FIG. 3 shows an evaluation circuit of a ground conductor monitoring device.

FIG. 3 shows an advantageous embodiment of the first voltage detector 17 and the second voltage detector 16. The first voltage detector 17 comprises a series circuit made up of a Zener diode 33, a resistor 34 and the light emitting diode of a optocoupler 35. The optocoupler 35 has an output connection which is connected to the signal line 19, so that when the light emitting diode of the optocoupler 35 is switched on, the corresponding signal can be output to the control unit 8.

The second voltage detector 16 comprises a series circuit made up of a Zener diode 30, a resistor 31 and the light emitting diode of an optocoupler 32. The optocoupler 32 has an output connection which is connected to the signal line 18, so that the corresponding signal can be output to the control unit 8 when the light emitting diode of the optocoupler 32 is switched on.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A ground conductor monitoring device comprising:
   a ground conductor connection that is adapted to connect a ground conductor potential of an electrical device external from the ground monitoring device;
   a first potential connection that is adapted to connect a first electrical potential which differs from the ground conductor potential;
   a second potential connection that is adapted to connect a second electric potential which differs from the first potential and the ground conductor potential;
   an electrical switching device that is adapted to establish, an electrical connection between the first potential connection and the ground conductor connection (connection state) or to interrupt the same (interruption state); and
   a control unit adapted to automatically output control signals to the electrical switching device,
   wherein the control unit evaluates electrical signals at the ground conductor connection at least in the interruption state, and
   wherein the evaluation of the electrical signals at the ground conductor connection takes place without measuring the current in the ground conductor, and
   wherein, averaged over time, the connection state is activated more often than the interruption state.

2. The ground conductor monitoring device according to claim 1, wherein the control unit uses the control signals generated by the control unit to automatically switch the electrical switching device between the switching states connection state and interruption state at predetermined regular and/or irregular time intervals.

3. The ground conductor monitoring device according to claim 1, wherein, averaged over time, the connection state is activated more often than the interruption state.

4. The ground conductor monitoring device according to claim 1, wherein based on the analyzed electrical signals at the ground conduction connection, the ground conductor monitoring device detects whether the ground conductor is connected to the first electrical potential and/or whether the ground conductor is connected to the second electrical potential.

5. The ground conductor monitoring device according to claim 1, wherein the electrical switching device is a semiconductor switch.

6. The ground conductor monitoring device according to claim 1, wherein the ground conductor monitoring device comprises a light signal device, via which a light signal is automatically emitted when the ground conductor monitoring device detects that the ground conductor is connected to the first potential and/or the ground conductor is connected to the second potential.

7. The ground conductor monitoring device according to claim 1, wherein the ground conductor monitoring device comprises an output interface via which a warning signal is automatically emitted when the ground conductor monitoring device detects that the ground conductor is connected to the first potential and/or the ground conductor is connected to the second potential.

8. The ground conductor monitoring device according to claim 7, wherein the output interface comprises a floating output connection.

9. The ground conductor monitoring device according to claim 1, wherein the ground conductor monitoring device comprises an evaluation circuit via which at least in the interruption state, the electrical signals at the ground conductor connection are evaluated via the control unit.

10. The ground conductor monitoring device according to claim 9, wherein the evaluation circuit comprises at least one first voltage detector connected between the ground conductor connection and the first potential connection and/or at least one second voltage detector connected between the ground conductor connection and the second potential connection.

11. The ground conductor monitoring device according to claim 10, wherein the first and/or the second voltage detector is designed as an optocoupler or comprises an optocoupler.

12. The ground conductor monitoring device according to claim 1, wherein the ground conductor monitoring device has a power supply device which is designed to supply at least the control unit and the electrical switching device with the electrical energy required for operation, wherein the power supply device extracts the electrical energy from the first and the second potential connection and releases it in a buffered manner.

13. The ground conductor monitoring device according to claim 1, wherein the ground conductor monitoring device is arranged in or on a terminal block.

14. A non-transitory computer readable medium storing instructions to carry out a method for monitoring a ground conductor of an electrical device, using a ground conductor monitoring device where the electrical device external from the ground monitoring device, that is grounded via the ground conductor, which, by means of a first electrical potential which differs from a ground conductor potential and a second electric potential which differs from the first potential and the ground conductor potential, supplies electrical energy and/or is supplied with electrical energy, the method comprising:
switching automatically by at least one electrical switching device between a connection state and an interruption state at predetermined regular and/or irregular time intervals, wherein in the connection state, an electrical connection between the first electrical potential and the ground conductor is established by the electrical switching device and in the interruption state, the electrical connection between the first electrical potential and the ground conductor is interrupted by the electrical switching device;
detecting and evaluating at least in the interruption state, electrical signals at the ground conductor; and
using the analyzed electrical signals at the ground conductor to detect whether the ground conductor is connected to the first electric potential and/or whether the ground conductor is connected to the second electrical potential,
wherein the evaluation of the electrical signals at the ground conductor connection takes place without measuring the current in the ground conductor, and
wherein, averaged over time, the connection state is activated more often than the interruption state.

15. The ground conductor monitoring device according to claim 1, wherein the electrical switching device is adapted to establish, with an electrical control signal, the electrical connection between the first potential connection and the ground conductor connection or to interrupt the same.

16. A ground conductor monitoring device comprising:
a ground conductor connection that is adapted to connect a ground conductor potential;
a first potential connection that is adapted to connect a first electrical potential which differs from the ground conductor potential;
a second potential connection that is adapted to connect a second electric potential which differs from the first potential and the ground conductor potential;
an electrical switching device that is adapted to establish, an electrical connection between the first potential connection and the ground conductor connection or to interrupt the same; and
a control unit adapted to automatically output control signals to the electrical switching device,
wherein the ground conductor monitoring device has a power supply device which is designed to supply at least the control unit and the electrical switching device with the electrical energy required for operation,
wherein the power supply device extracts the electrical energy from the first and the second potential connection and releases it in a buffered manner,
wherein the control unit evaluates electrical signals at the ground conductor connection at least in the interruption state,
wherein the evaluation of the electrical signals at the ground conductor connection takes place without measuring the current in the ground conductor, and
wherein, averaged over time, the connection state is activated more often than the interruption state.

17. An electrical device, comprising:
a mounting rail having a ground conductor potential;
a terminal block configured attached to the mounting rail; and
a ground conductor monitoring device disposed within the terminal block, comprising:
a ground conductor connection that is adapted to connect the ground conductor potential;
a first potential connection that is adapted to connect a first electrical potential which differs from the ground conductor potential;
a second potential connection that is adapted to connect a second electric potential which differs from the first potential and the ground conductor potential;
an electrical switching device that is adapted to establish, an electrical connection between the first potential connection and the ground conductor connection or to interrupt the same; and
a control unit adapted to automatically output control signals to the electrical switching device,
wherein the control unit evaluates electrical signals at the ground conductor connection at least in the interruption state,
wherein the evaluation of the electrical signals at the ground conductor connection takes place without measuring the current in the ground conductor, and
wherein, averaged over time, the connection state is activated more often than the interruption state.

18. The ground conductor monitoring device according to claim 1, wherein the control unit evaluates electrical signals at the ground conductor connection in the interruption state and in the connection state.

19. The ground conductor monitoring device according to claim 1, wherein the control signals comprise a switch-on signal and a switch-off signal, which, when sent to the electrical switching device, result in a pulse width modulated signal that drives the electrical switching device.

20. The ground conductor monitoring device according to claim 19, wherein the pulse width modulated signal has a 95% switch-on-time and a 5% switch-off-time.

21. The ground conductor monitoring device according to claim 1, wherein the ground conductor connection and/or the control unit is configured for direct coupling with the ground conductor potential without any resistor therebetween.

\* \* \* \* \*